US007885365B2

(12) United States Patent
Hagleitner et al.

(10) Patent No.: US 7,885,365 B2
(45) Date of Patent: Feb. 8, 2011

(54) LOW-POWER, LOW-AREA HIGH-SPEED RECEIVER ARCHITECTURE

(75) Inventors: Christoph Hagleitner, Zug (CH); Christian I. Menolfi, Langnau am Albis (CH); Martin L. Schmatz, Rueschliken (CN); Thomas H. Toifl, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 693 days.

(21) Appl. No.: 11/848,599

(22) Filed: Aug. 31, 2007

(65) Prior Publication Data

US 2009/0060091 A1    Mar. 5, 2009

(51) Int. Cl.
*H04L 7/00* (2006.01)

(52) U.S. Cl. .................. 375/355; 375/354; 375/357; 375/371; 375/372; 375/316; 455/135; 455/161.3; 455/260

(58) Field of Classification Search ............... 375/354, 375/357, 371, 372, 316; 455/135, 161.3, 455/260
See application file for complete search history.

(56) References Cited

U.S. PATENT DOCUMENTS

| 4,021,686 | A  | * | 5/1977  | Zuk ............................ 327/217 |
| 5,648,964 | A  | * | 7/1997  | Inagaki et al. ................ 370/228 |
| 6,510,503 | B2 | * | 1/2003  | Gillingham et al. .......... 711/167 |
| 6,970,529 | B2 |   | 11/2005 | Cranford, Jr. et al. |
| 7,039,147 | B2 |   | 5/2006  | Donnelly et al. |
| 7,457,391 | B2 | * | 11/2008 | Gregorius et al. ........... 375/373 |
| 2004/0125905 | A1 | * | 7/2004  | Vlasenko et al. ............. 375/376 |
| 2004/0202266 | A1 | * | 10/2004 | Gregorius et al. ........... 375/355 |
| 2004/0210790 | A1 | * | 10/2004 | Moon et al. .................. 713/500 |
| 2005/0058234 | A1 | * | 3/2005  | Stojanovic ................... 375/371 |
| 2006/0145740 | A1 | * | 7/2006  | Park et al. .................... 327/158 |
| 2008/0273528 | A1 | * | 11/2008 | Maheshwari et al. ........ 370/384 |
| 2009/0189658 | A1 | * | 7/2009  | Tomar et al. ................. 327/158 |

OTHER PUBLICATIONS

Low-Power Area-efficient High-Speed I/O Circuit Techniques, Lee et al., 2000 IEEE, pp. 1591-1599.

* cited by examiner

*Primary Examiner*—Shuwang Liu
*Assistant Examiner*—Kenneth Lam
(74) *Attorney, Agent, or Firm*—Cantor Colburn LLP; Stephen Kaufman

(57) ABSTRACT

A high-speed receiver includes multiple receiver components. Each receiver component includes sampling latches for receiving data, phase rotators for controlling timing of sampling of data by the sampling latches, and a clock-tracking logic stage for providing clock and data recovery. The clock-tracking logic stage is divided into a high-speed early/late (E/L) logic and aggregation counter section and a low-speed logic section, separated by a synchronization logic block. The receiver also includes a delay locked loop (DLL) for receiving an input clock signal corresponding to a data rate of the received data, providing coarse delay adjustment of the clock signal and outputting multiple clock phase vectors corresponding to the adjusted clock signal to the phase rotators on each receiver component. The phase rotators control sampling of the data based on the clock phase vectors received from the DLL. A single regulated power supply regulator regulates power supplied to the DLL and the phase rotators.

5 Claims, 3 Drawing Sheets

LOW-POWER, LOW-AREA HIGH-SPEED RECEIVER ARCHITECTURE

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND

The present invention relates to receiver architecture, in particular, high-speed receiver architecture.

In high-speed receiver circuits, data is sent from a transmit chip to a receiving chip on a printed circuit board. The data bits are sent as differential voltage signals, corresponding to binary symbols. The receiver circuit performs the function of clock and data recovery (CDR). It samples the data and also tracks the timing of the data with high precision.

High speed receiver circuits are useful for short chip-to-chip communications between two microprocessors (μp), a μp and memory, a μp and a graphics chip, etc. Standards for use of high speed receivers include HyperTransport, FB-DIMM, PCI Express, etc.

High speed receiver chips are also useful for backplane communication across longer distances. There are various standards of use for high speed receiver for backplane communication, including Fiberchannel, Ethernet, etc.

Two important factors to consider in comparing receiver circuits are area ($mm^2$/Gbps) and power (mW/Gpbs). Current architectures for high speed receivers include a differential CML ("Current Mode Logic") receiver. These receivers typically have an area of greater than 50000 $\mu m^2$ and require power of greater than 10 mW/Gpbs.

SUMMARY

According to in exemplary embodiment, a high-speed receiver including multiple receiver components is provided. Each receiver component includes sampling latches for receiving data in the form of differential voltage signals corresponding to binary symbols, phase rotators for controlling for controlling timing of sampling of data by the sampling latches, and a clock-tracking logic stage for providing clock and data recovery. The clock-tracking logic stage is divided into a high-speed early/late (E/L) logic and aggregation counter section and a low-speed logic section, separated by a synchronization logic. The receiver also includes a delay locked loop (DLL) for receiving an input clock signal corresponding to a data rate of the received data, providing coarse delay adjustment of the clock signal and outputting multiple clock phase vectors corresponding to the adjusted clock signal to the phase rotators on each receiver component. The phase rotators control sampling of the data based on the clock phase vectors received from the DLL. A single regulated power supply regulator regulates power supplied to the DLL and the phase rotators.

BRIEF DESCRIPTION OF THE DRAWINGS

Referring to the exemplary drawings, wherein like elements are numbered alike in the several Figures.

DETAILED DESCRIPTION

Pseudo-digital style static CMOS circuit designs lead to lower power and area than traditional CML style receivers. However, the pseudo-digital static CMOS circuit designs suffer from power supply noise. This is because the power supply voltage inevitably carries voltage noise, which corrupts the timing of the sampling clocks. With static CMOS-system logic, 1% of power supply change corresponds to 1% of delay change. This is unacceptable since the sample time must be accurate within a few ps. According to an exemplary embodiment, an architecture copes with the noise on the power supply.

Figure 1:
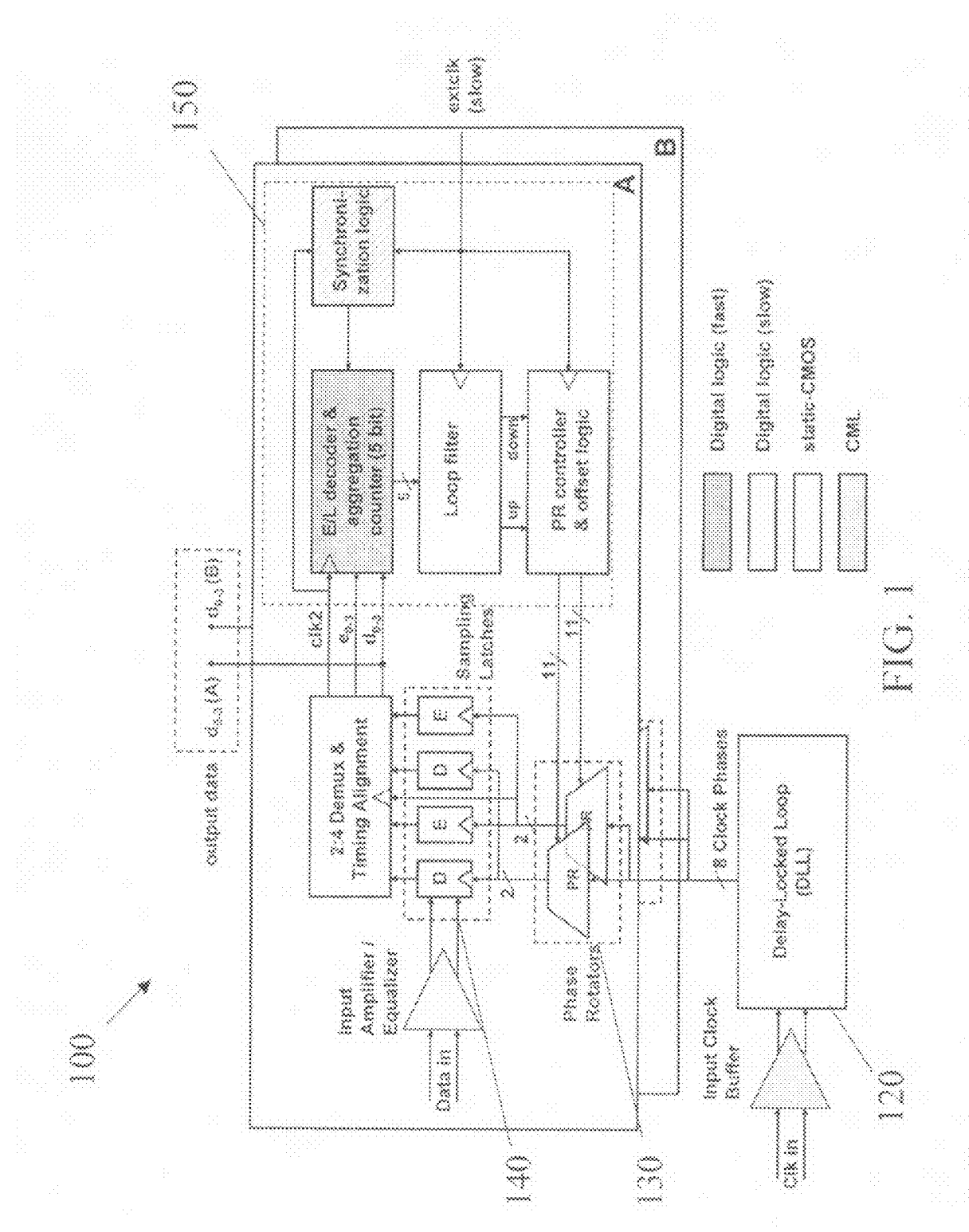
FIG. 1 illustrates high-speed receiver architecture according to an exemplary embodiment.

FIG. 1 illustrates a high-speed receiver architecture according to an exemplary embodiment. The receiver 100 includes multiple receivers that share a single DLL clock phase generator 120. In FIG. 1, two receivers (also referred to as receiver "components") A and B are shown for simplicity of illustration. It should be appreciated, however, that the receiver 100 may include any number of receiver components. The DLL, 120 generates clock phase vectors based on a clock signal received from an input clock buffer. The DLL 120 supplies the clock phase vectors to N phase rotators 130 on each receiver component, where N represents an integer. The DLL 120 and the phase rotators 130 share a single supply regulator (illustrated in FIG. 2). The phase rotators 130 feed into sampling latches 140 that control sampling of data received as differential voltage signals corresponding to binary symbols via an input amplifier/equalizer. The phase rotators 130 may include phase selectors for selecting phase clock vectors from the DLL, 120 and phase interpolators for providing an output clock signal for controlling timing of sampling by the sampling latches 140. The rise/fall times of the phase interpolators may be controlled via switchable capacitive loads. Data sampled by the sampling latches 140 is output via a demultiplexer and timing alignment mechanism.

Each receiver component A, B includes a clock-tracking logic stage 150, indicated by dashed lines in FIG. 1. The clock-tracking logic stage provides for clock and data recovery. The clock-tracking logic stage 150 includes an early late (E/L) decoder and aggregation counter that may run at high speed. The clock-tracking logic stage further includes synchronization logic, a loop filter, and a phase rotator (PR) controller and offset logic. With the exception of the E/L decoder and aggregation counter each of these components may run at slow speed, e.g., 1/32 of the data rate. Thus, the amount of logic running at high speed is minimized, thereby minimizing power consumption.

The clock-tracking logic stage 150 feeds signals into the phase rotators 130 to control the timing of the sampling clocks. The synchronization stage provides synchronization between the two clock domains, i.e., between the clock domain derived from the received data, clk2, which provides the clock for the aggregation counter, and a slow, externally provided clock, denoted extclk in FIG. 1.

According to one embodiment, the receiver may be implemented as a dual channel receiver including two independent receiver channels. In one embodiment, the area of the receiver may be 120 μm×260 μm (for two channels). The data range may be 8-10 Gbps, and the power consumption may be 2.6 mW/Gpbs.

Figure 2:
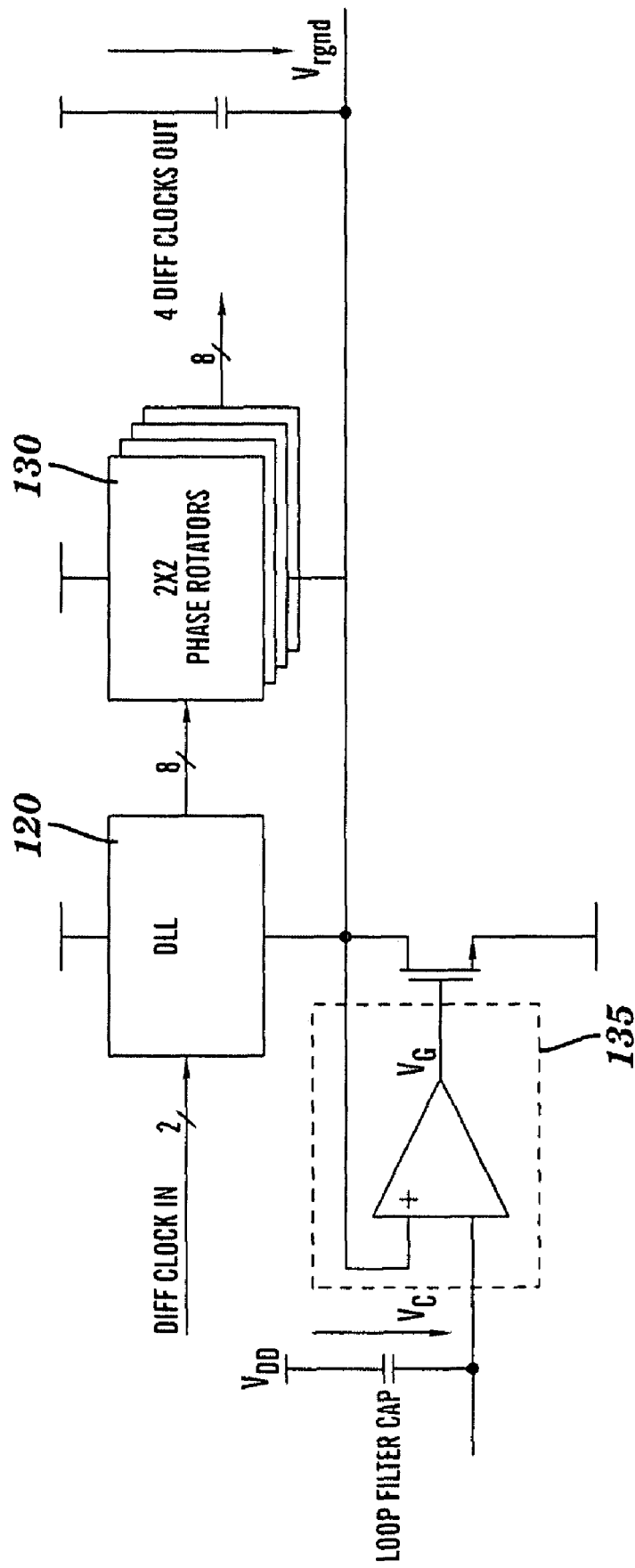
FIG. 2 illustrates a DLL and phase rotators sharing a single regulated power supply according to an exemplary embodiment.

FIG. 2 illustrates a DLL, and N phase rotators sharing a single regulated power supply according to an exemplary embodiment. Regulating the power supply mitigates effects of power supply variation. The power supply regulator 135 may be implemented with a single stage operational amplifier for high-speed. The reference voltage $V_c$ may be set by the DLL, such that the delay in the delay line of the DLL is approximately 1 unit interval (UI) of the received data, the UI denoting the bit period (in seconds), e.g. 1 UI=100 ps for 10 Gbit/s data transmission. A coarse delay adjustment mechanism (e.g., 16 steps) may be used in the DLL to adjust for different data rates and process variations. The voltage of the regulated power supply $V_{rgnd}$ may be set up at startup to be 0.8 V. The regulated voltage drop may be kept at 0.8 V for all process corners to accommodate thee coarse delay adjustment. This ensures a well-controlled signal swing over all process corners.

According to an exemplary embodiment, a feed-forward power-supply compensation circuit may be provided to amplify power-supply transients and provide fast corrects to the current source. The feed-forward power supply may allow rapid, e.g., less than 50 ps, counteraction to power-supply jumps.

Figure 3:
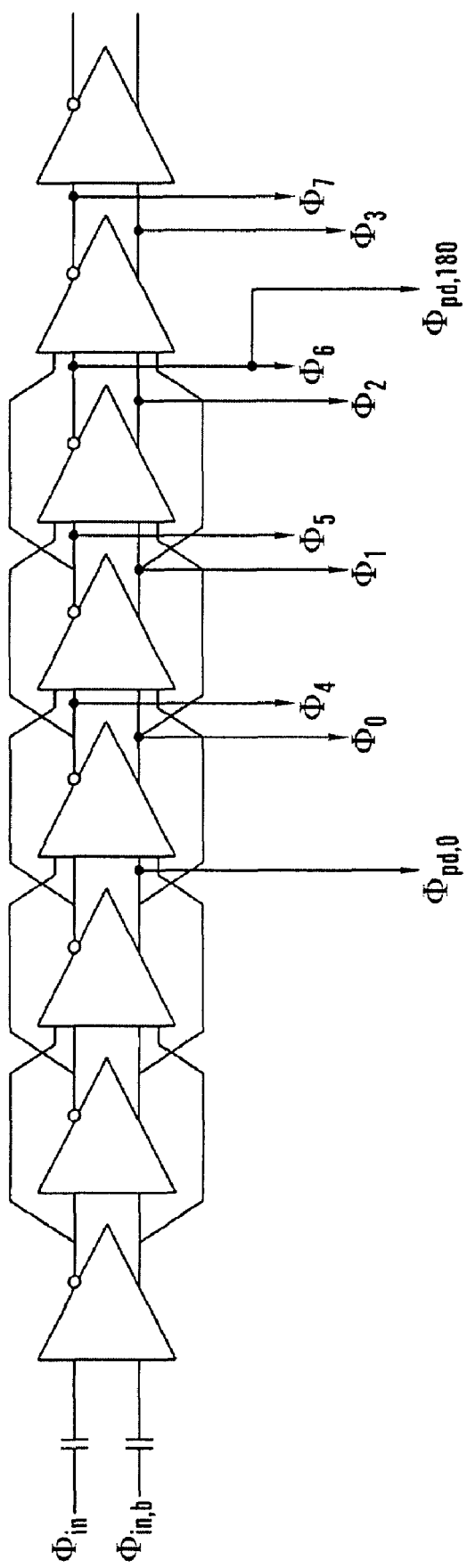
FIG. 3 illustrates all inverter-based delay line according to an exemplary embodiment.

The delay line in the DLL discussed above may be implemented with an inverter-based delay line with a feed-forward path for speed-up and coarse delay control, as illustrated in FIG. 3. It may include, e.g., eight elements (three for pulse shaping, four to provide the accurate delays, and one dummy cell to provide accurate capacitive loading). Clock phases $\Phi_{pd,0}$ and $\Phi_{pd,180}$ may be used in the DLL phase detector. According to an exemplary embodiment, the delay line provides coarse delay adjustment with a feed-forward path to adapt for process variations. It may include a number of K (e.g., 16) coarse adjustment steps, which may be set by some digital value. The digital coarse adjustment value may be externally set such that the signal swing in the delay line results in a given value (e.g., 0.8 V). Hence, a constant swing over all process corners can be achieved. Small cross-coupled inverters in the delay cells ensure a 180 degrees phase relation.

According to an exemplary embodiment, the coarse phase delay adjustment delay line may be implemented with CMOS delay cells. Phases n-1 and n-2 may be "blended" by a predetermined amount to drive phase n. This leads to a speed-up of the delay line, which allows for higher data rates.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof Therefore, it is intended that the invention not be limited to the particular embodiment disclosed as the best mode contemplated for carrying out this invention, but that the invention will include all embodiments falling within the scope of the appended claims.

What is claimed is:

1. A high-speed receiver, comprising:
    multiple receiver components, wherein each receiver component comprises:
        sampling latches for receiving data in a form of differential voltage signals corresponding to binary symbols;
        phase rotators for controlling timing of sampling of data by the sampling latches; and
        a clock-tracking logic stage for providing clock and data recovery, which is divided into a high-speed early/late (E/L) logic and aggregation counter section and a low-speed logic section, separated by a synchronization logic block operating in response to an external clock slower than the data rate, the (E/L) logic providing an output to a loop filter, the loop filter operating in response to the external clock slower than the data rate, the loop filter generating an up/down output to a phase rotator controller and offset logic, the phase rotator controller and offset logic receiving an output from the synchronization logic block and generating an output to the phase rotators, the phase rotator controller operating in response to the external clock slower than the data rate;
    a delay locked loop (DLL) for receiving an input clock signal corresponding to a data rate of the received data, providing coarse delay adjustment of the clock signal and outputting multiple clock phase vectors corresponding to the adjusted clock signal to the phase rotators on each receiver component, wherein the phase rotators control sampling of the data based on the clock phase vectors received from the DLL; and
    a single regulated power supply regulator for regulating power supplied to the DLL and the phase rotators.

2. The high-speed receiver of claim 1, wherein a voltage drop on the regulated power supply is maintained at approximately 0.8 volts.

3. The high-speed receiver of claim 1, wherein the DLL provides a digitally controllable coarse delay adjustment for different data rates and process variations.

4. The high-speed receiver of claim 1, wherein the DLL includes an inverter-based delay line with 8 delay elements and a feed-forward path for speed-up and coarse delay control.

5. The high speed receiver of claim 1, wherein each phase rotator includes multiple phase selectors for selecting phase vectors received from the DLL and multiple phase interpolators for providing an output clock signal for controlling timing of sampling by the sampling latches.

* * * * *